US012142467B2

(12) United States Patent
Liang et al.

(10) Patent No.: US 12,142,467 B2
(45) Date of Patent: Nov. 12, 2024

(54) SELF-ASSEMBLED MONOLAYER DEPOSITION FROM LOW VAPOR PRESSURE ORGANIC MOLECULES

(71) Applicant: Applied Materials, Inc., Santa Clara, CA (US)

(72) Inventors: Qiwei Liang, Fremont, CA (US); Srinivas D. Nemani, Sunnyvale, CA (US); Keith Tatseun Wong, Mountain View, CA (US); Antony K. Jan, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 17/333,533

(22) Filed: May 28, 2021

(65) Prior Publication Data
US 2021/0375600 A1 Dec. 2, 2021

Related U.S. Application Data

(60) Provisional application No. 63/033,266, filed on Jun. 2, 2020.

(51) Int. Cl.
*H01J 37/32* (2006.01)
*C23C 16/04* (2006.01)
*H01L 21/027* (2006.01)
*H01L 21/32* (2006.01)

(52) U.S. Cl.
CPC ...... *H01J 37/32816* (2013.01); *C23C 16/042* (2013.01); *H01J 37/32449* (2013.01); *H01J 37/32522* (2013.01); *H01L 21/0271* (2013.01); *H01L 21/32* (2013.01)

(58) Field of Classification Search
None
See application file for complete search history.

(56) References Cited

U.S. PATENT DOCUMENTS

| 10,358,715 | B2 | 7/2019 | Kaufman-Osborn et al. |
| 2003/0101938 | A1* | 6/2003 | Ronsse ............... C23C 16/4401 118/712 |
| 2015/0170903 | A1 | 6/2015 | Negreira et al. |
| 2017/0088949 | A1 | 3/2017 | Babayan et al. |
| 2017/0108210 | A1 | 4/2017 | Meinhart et al. |
| 2017/0306491 | A1 | 10/2017 | Liang et al. |
| 2017/0350004 | A1 | 12/2017 | Kaufman-Osborn et al. |
| 2018/0366317 | A1* | 12/2018 | Ke .................. H01L 21/0206 |
| 2020/0118809 | A1 | 4/2020 | Reddy et al. |

FOREIGN PATENT DOCUMENTS

WO 2019202418 A1 10/2019

OTHER PUBLICATIONS

International Search Report and Written Opinion for International application No. PCT/US2021/035266, dated Sep. 1, 2021, 12 pages.

* cited by examiner

*Primary Examiner* — Joseph A Miller, Jr.
(74) *Attorney, Agent, or Firm* — Lowenstein Sandler LLP

(57) ABSTRACT

The present disclosure generally relates to a substrate processing chamber, a substrate processing apparatus, and a substrate processing method for self-assembled monolayer (SAM) deposition of low vapor pressure organic molecules (OM) followed by further substrate processing, such as atomic layer deposition.

13 Claims, 7 Drawing Sheets

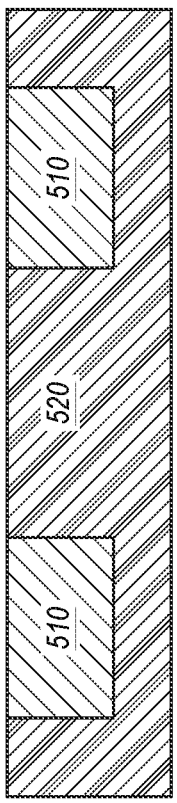
FIG. 4A
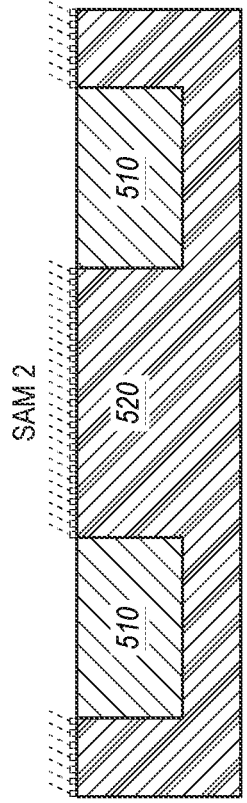
FIG. 4B
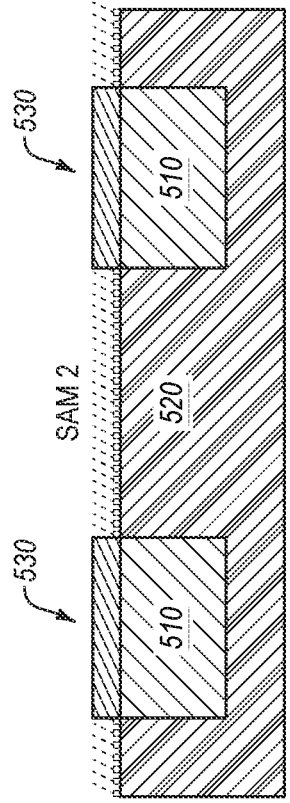
FIG. 4C
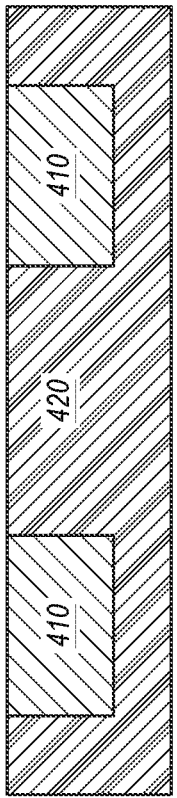
FIG. 5A
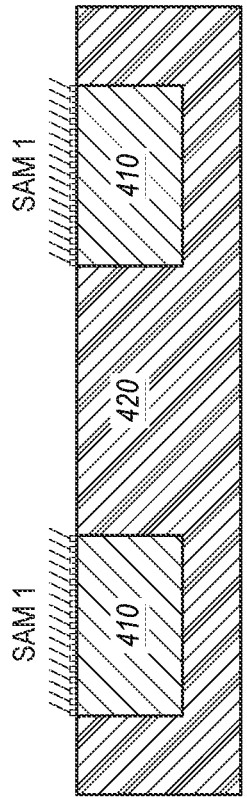
FIG. 5B
FIG. 5C

SELF-ASSEMBLED MONOLAYER DEPOSITION FROM LOW VAPOR PRESSURE ORGANIC MOLECULES

RELATED APPLICATIONS

This patent application claims the benefit under 35 U.S.C. § 119(e) of U.S. Provisional Application No. 63/033,266, filed Jun. 2, 2020.

TECHNICAL FIELD

Embodiments of the present disclosure relate, in general, to a substrate processing chamber, a substrate processing system, and a substrate processing method. In particular, the present disclosure relates to deposition of a self-assembled monolayer from low vapor pressure organic molecules on a substrate.

BACKGROUND

Reliably producing sub-half micron and smaller features is one of the key technology challenges for next generation very large scale integration (VLSI) and ultra large scale integration (ULSI) of semiconductor devices. However, as the limits of circuit technology are pushed, the shrinking dimensions of VLSI and ULSI technology have placed additional demands on processing capabilities.

As circuit densities increase for next generation devices, the widths of interconnects, such as trenches, contacts, gate structures and other features, as well as the dielectric materials therebetween, decrease to 45 nm and 32 nm dimensions and beyond. In order to enable the fabrication of next generation devices and structures, three dimensional (3D) stacking of features in semiconductor chips is often utilized. In particular, fin field effect transistors (FinFETs) are often utilized to form three dimensional (3D) structures in semiconductor chips. By arranging transistors in three dimensions instead of conventional two dimensions, multiple transistors may be placed in the integrated circuits (ICs) very close to each other. As circuit densities and stacking increase, the ability to selectively deposit subsequent materials on previously deposited materials gains importance.

Self-assembled monolayers (SAMs) may be utilized as a masking material to improve subsequent material deposition selectivity. SAMs are generally surface chemistry dependent and can be formed preferentially on various materials. However, current apparatuses for depositing SAMs often suffer from slow deposition rates or insufficient deposition amounts which undesirably decrease throughput.

BRIEF SUMMARY OF EMBODIMENTS

In some embodiments, a processing chamber is described herein. The processing chamber includes a chamber body, a lid plate, at least one evaporator, a substrate support, a showerhead, a first heater, and a second heater. The chamber body and the lid plate define an interior volume of the processing chamber. The lid plate supports at least one evaporator. The substrate support is disposed in the interior volume of the processing chamber. The showerhead is disposed above the substrate support. The first heater is disposed in the interior volume of the processing chamber between the showerhead and the substrate support. The first heater is configured to provide temperature control during self-assembled monolayer (SAM) deposition. The second heater is disposed in the interior volume of the processing chamber. The second heater is configured to provide temperature control during SAM annealing.

In some embodiments, a substrate processing system is described herein. The substrate processing system includes a first processing chamber and a second processing chamber. The first processing chamber is configured to perform a self-assembled monolayer (SAM) treatment process. The second processing chamber is configured to perform atomic layer deposition process on a wafer subjected to a SAM treatment process in the first processing chamber. The first processing chamber includes a chamber body, a lid plate, at least one evaporator, a substrate support, a showerhead, a first heater, and a second heater. The chamber body and the lid plate define an interior volume of the processing chamber. The lid plate supports at least one evaporator. The substrate support is disposed in the interior volume of the processing chamber. The showerhead is disposed above the substrate support. The first heater is disposed in the interior volume of the processing chamber between the showerhead and the substrate support. The first heater is configured to provide temperature control during self-assembled monolayer (SAM) deposition. The second heater is disposed in the interior volume of the processing chamber. The second heater is configured to provide temperature control during SAM annealing.

In some embodiments, a substrate processing method is described herein. The substrate processing method includes flowing an evaporated low vapor pressure organic molecule (OM) into a first processing chamber that includes a substrate. The substrate processing method further includes depositing, in the first processing chamber, the low vapor pressure OM onto at least a first portion of the substrate at a first temperature and a first pressure to form a self-assembled monolayer (SAM) on at least the first portion of the substrate. The substrate processing method further includes annealing, in the first processing chamber, the SAM on at least the first portion of the substrate at a second temperature and a second pressure. The second pressure is greater than the first pressure. The second temperature is greater than the first temperature.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 4A-4C depict schematics of self-assembled monolayer (SAM1) deposition on a patterned substrate followed by ALD deposition, according to certain embodiments.

FIGS. 5A-5C depict schematics of self-assembled monolayer (SAM2) deposition on a patterned substrate followed by ALD deposition, according to certain embodiments.

DETAILED DESCRIPTION OF EMBODIMENTS

Figure 1:
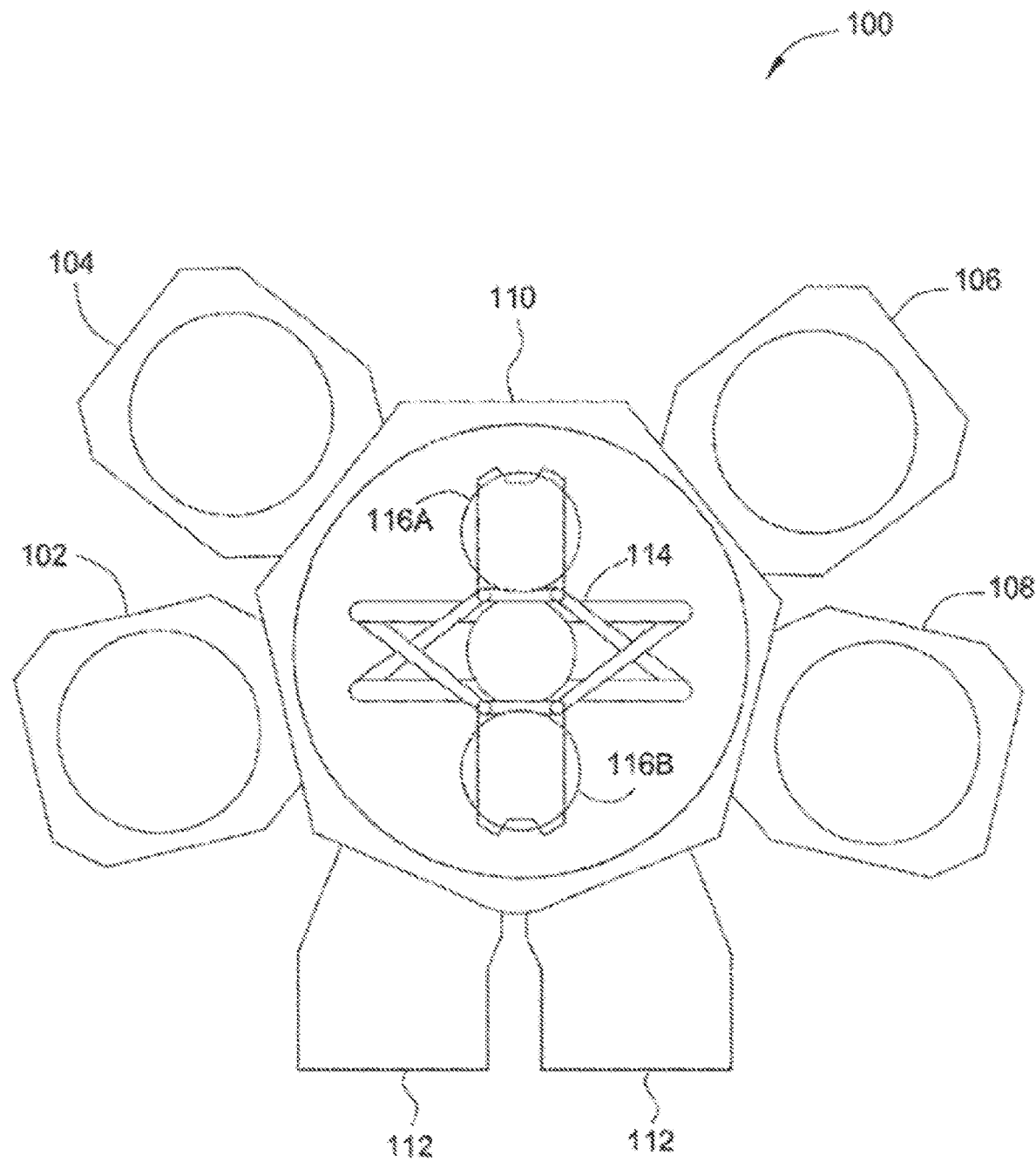
FIG. 1 depicts a substrate processing system, according to certain embodiments.

As semiconductor circuits become ever smaller and more intricate, it becomes more imperative that all manufacturing processes that define the conductive, metallic pathways are carefully aligned from bottom layer to top. Self-assembled monolayers (SAMs) utilize innate chemical selectivity to propagate an existing pattern in one layer to the next, without an additional, costly alignment step. Low vapor pressure organic molecules (OM) are more thermally stable than other OM, which permits more process flexibility.

Low vapor pressure organic molecules can be vapor deposited by thermal evaporation from a reservoir that has line-of-sight to a wafer (or substrate) which has been pre-processed to have a pattern of metallic and dielectric surfaces. The OM are functionalized to selectively form a self-assembled monolayer (SAM) on a first surface, but not the second. In the subsequent deposition step, this SAM blocks growth over the first surface but not the second one, thus propagating the pattern into the next layer.

Existing SAMs are deposited by exposing a patterned wafer (or substrate) to a liquid solution of the OM. For example, liquid phase OM delivery may be implemented by dipping or spin coating the patterned substrate in the OM liquid solution and removing the solvent after completion of the OM bonding to the surface of the substrate. High quality SAMs deposited from solution can take hours or days to form, and liquid processes are less compatible with the majority of semiconductor processes.

Vapor-based approaches include transporting the OM in the vapor phase via a carrier gas (flowing an inert gas over or through a heated reservoir of OM that lacks line-of-sight to the wafer). Previous attempts that used a carrier gas to transport OM vapor from a reservoir to the chamber have not delivered sufficient amounts of OM to form an adequate SAM because of their low vapor pressure.

Embodiments described herein are directed to processing chambers, substrate processing apparatus, and substrate processing methods that incorporate a vapor-based approach for depositing SAMs and that has the OM reservoir in the same chamber as the wafer (or substrate) and with line-of-sight to the substrate. Direct line-of-sight thermal evaporation increases the amount of OM that is delivered and improves the overall SAM quality (e.g., amount and density of the SAM that is deposited) while doing so in an expedient manner relative to existing liquid phase delivery methods. Directly injecting the OM vapor precursors to a substrate positioned directly underneath the injection outlet also provides better control of the temperature of the OM vapor precursors throughout their entire flow path to the substrate, reduces an amount of particles formed or accumulated through a longer flow of the OM vapors, takes up less space, and ultimately is more cost effective.

In comparison, existing SAM treatment approaches utilize a plurality of processing chambers and utilize delivery lines to deliver the OM vapors. Such architectures make it more challenging to control the temperature of the OM vapors along their entire flow path, which could lead to condensation of the OM vapors along the flow path and reduced amounts of OM vapors delivered to the substrate to form a high-quality SAM. Such architecture also leads to generation of more particles which contribute to substrate defects (e.g., bubble formations). Hence, not only may a SAM fail to be deposited successfully with existing architectures/approaches, but these architectures/approaches also take up more space and may be more costly than embodiments described herein.

The vapor phase approaches according to embodiments described herein are more compatible with current semiconductor process flows as compared to existing solution phase and vapor phase approaches for forming SAMs. Additionally, the throughput of the approaches described herein can be improved as compared to existing solution phase and vapor phase approaches.

Embodiments described herein relate to apparatuses and methods for processing a substrate. In one embodiment, a substrate processing system is provided having a transfer chamber, a self-assembled monolayer (SAM) treatment chamber, and an atomic layer deposition (ALD) chamber. A substrate may be processed by the substrate processing system and transferred between the SAM treatment chamber and the ALD chamber. Transfer of the substrate between the chambers may be facilitated by the transfer chamber which houses a transfer robot.

In certain embodiments, the SAM treatment chamber includes a chamber body and a lid plate that together define an interior volume of the processing chamber and at least one evaporator mounted on the lid plate. The interior volume of the processing chamber includes a substrate support, a showerhead disposed above the substrate support, a first heater (which may be a rotating heater) disposed between the substrate support and the showerhead, and a second heater (which may be a lamp assembly). The entire SAM treatment occurs in a single SAM treatment chamber, including low temperature and low pressure SAM deposition and high temperature and high pressure SAM annealing.

The organic molecule (OM) used for SAM treatment is held in the at least one thermal evaporator with line-of-sight to the substrate support that is disposed in the interior volume of the processing chamber. The thermal evaporator includes a crucible through which the OM vapors pass through. The crucible may further include the OM source (which could be in a solid form or in a liquid form). A shutter or a nozzle over the opening of the crucible defines the flux of OM to the substrate surface, which is positioned on the substrate support with a patterned surface of the substrate facing the crucible opening. The crucible is heated (e.g., with its own designated heater, such as a lamp) to a temperature sufficient to induce sublimation or vaporization of OM. Then the shutter or nozzle is opened for a predetermined time to allow flow of OM vapors to the substrate and their deposition onto the substrate surface as a SAM. The substrate is post-processed (e.g., annealed) to remove excess deposit and form a well-packed SAM (i.e., a dense SAM). In certain embodiments, a well-packed SAM has a water contact angle that is greater than 100 degrees. In certain embodiments, a well-packed SAM deposited by the system and methods described herein is thicker than SAM's deposited by existing approached (e.g., existing vapor phase approached and/or existing liquid phase approaches).

With existing methods, after SAM deposition, the substrate is exposed to ambient conditions (e.g., temperature) for hours (e.g., 24 hours) before being subjected to ALD processing. With the instant method, the substrate (having the SAM deposited thereon) is annealed in vacuum in the same chamber where SAM deposition takes place. Such annealing takes a few minutes (as compared to the several hours seen in existing methods) after which the substrate may be moved to a subsequent processing chamber for further processing (e.g., ALD processing). The OM to be evaporated is typically a hydrocarbon of varying chain length (typically containing greater than 4 and fewer than 30 carbons), with a functionalized head group, and optionally a functionalized tail group. The head group may include phosphonates, alkylsilanes, alkoxysilanes, and/or chlorosilanes. In the case of phosphonates, the SAM forms on exposed metal surfaces of the patterned wafer, but not on exposed dielectric surfaces on the patterned wafer, due to inherent chemical selectivity. In the case of the alkylsilanes, alkoxysilanes, and chlorosilanes, the SAM forms on the dielectric surfaces but not the metal surfaces.

After SAM formation, the substrate can be transferred from a SAM processing chamber to a second processing chamber (e.g., atomic layer deposition (ALD) processing chamber), and a second layer can be deposited by ALD. In one embodiment, two or more precursors are separately and sequentially delivered in the vapor phase to the patterned surface to perform the ALD. In certain embodiments, the reaction of these precursors forms a film where there is no pre-existing SAM layer, and fails to form a film where there is a preexisting SAM layer.

As utilized herein, "self-assembled monolayer" (SAM) generally refers to a layer of molecules that are attached (e.g., by a chemical bond) to a surface and that have adopted a preferred orientation with respect to that surface and even with respect to each other. The SAM typically includes an organized layer of amphiphilic molecules in which one end of the molecule, the "head group", shows a specific, reversible affinity for a substrate. Selection of the head group will depend on the application of the SAM, with the type of SAM compounds being based on the substrate utilized. Generally, the head group is connected to an alkyl chain in which a tail or "terminal end" can be functionalized, for example, to vary wetting and interfacial properties. The molecules that form the SAM will selectively attach to one material over another material (e.g., metal vs. dielectric), allowing for selective subsequent deposition (e.g., ALD) on materials not coated with the SAM (or alternatively on materials coated with the SAM).

FIG. 1 illustrates a schematic, plan view of a substrate processing system 100 according to one embodiment described herein. Generally, the substrate processing system 100 includes a plurality of process chambers 102, 104, 106, 108, a transfer chamber 110, and load lock chambers 112. Each of the process chambers 102, 104, 106, 108 are coupled to the transfer chamber 110. In one embodiment, the process chamber 104 is disposed adjacent the process chamber 102. In one embodiment, the process chamber 106 is disposed adjacent the process chamber 104. In one embodiment, the process chamber 108 is disposed adjacent the process chamber 106. Each process chamber represents, and may be used for, a different stage or phase of substrate processing.

For instance, in one embodiment, the process chamber 102 is a pre-clean chamber. The process chamber 102 prepares surfaces of a substrate being processed for subsequent processing. In various examples, the process chamber 102 may remove substrate defects which result from air exposure, remove native oxide layers, and/or remove sacrificial layers disposed on a surface of the substrate to be treated by SAM and/or ALD processing. In another example, the process chamber 102 is utilized for substrate surface functionalization. In this example, surface terminal groups may be modified to enable, assist, or prevent the formation of a SAM on the substrate, depending upon implementation.

Specific examples of surface treatment which may be performed by the process chamber 102 include metal oxide removal via plasma treatment, surface hydroxyl functionalization using $H_2/O_2$ plasma treatment or water vapor exposure, and/or oxide removal. In certain embodiments, the process chamber 102 is utilized to create a patterned substrate with metal portions and dielectric portions in order to enable selective area SAM adsorption, as further explained with respect to FIGS. 4A-4C and 5A-5C below.

For example, FIGS. 4A and 5A depict an exemplary schematic of a substrate having a patterned surface which includes portions 410, 510 with a metallic surface and portions 420, 520 with a dielectric surface in FIGS. 4A and 5A, respectively. Patterned surfaces such as the ones depicted in FIGS. 4A and 5A may be prepared in processing chamber 102.

The OM to be evaporated in order to form a SAM is typically a hydrocarbon of carrying chain length. For instance, the OM may contain anywhere from 4, 5, 6, 7, 8, 9, 10, 11, 12, 13, 14, 15, or 16 to any of 17, 18, 19, 20, 21, 22, 23, 24, 25, 26, 27, 28, 29, or 30 carbon atoms. The OM has a at least a functionalized head group and may also have a functionalized tail group. The functionalized head group and/or tail group determine the affinity of the OM to a particular surface.

For instance, phosphonate functional groups have inherent chemical selectivity to exposed metal surfaces and would form a self-assembled monolayer on the metal portions as shown by SAM1 in FIG. 4B. Exemplary SAM precursors with phosphonate functional groups include, without limitations, phosphonic acid materials, such as methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, decylphosphonic acid, undecylphosphonic acid, dodecylphosphonic acid, tridecylphosphonic acid, tetradecyphosphonic acid, pentadecylphosphonic acid, hexadecylphosphonic acid, heptadecylphosphonic acid, octadecylphosphonic acid, and nonadecylphosphonic acid.

In comparison, alkylsilanes, alkoxysilanes, and chlorosilanes have greater affinity to dielectric surfaces and would form a self-assembled monolayer on the dielectric portions as shown by SAM2 in FIG. 5B. Exemplary SAM precursors with silane functional groups include, without limitations, chlorosilane materials, such as methyltrichlorosilane, ethyltrichlorosilane, propyltrichlorosilane, butyltrichlorosilane, pentyltrichlorosilane, hexyltrichlorosilane, heptyltrichlorosilane, octyltrichlorosilane, nonyltrichlorosilane, decyltrichlorosilane, undecyltrichlorosilane, dodecyltrichlorosilane, tridecyltrichlorosilane, tetradecyltrichlorosilane, pentadecyltrichlorosilane, hexadecyltrichlorosilane, heptadecyltrichlorosilane, octadecyltrichlorosilane, and nonadecyltrichlorosilane.

Exemplary SAM precursors with silane functional groups may also include, without limitations, oxysilane materials, such as methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, nonyltrimethoxysilane, nonyltriethoxysilane, decyltrimethoxysilane, decyltriethoxysilane, undecyltrimethoxysilane, undecyltrethoxysilane, dodecyltrimethoxysilane, dodecyltriethoxysilane, tridecyltrimethoxysilane, tridecyltriethoxysilane, tetradecyltrimethoxysilane, tetradecyltriethoxysilane, pentadecyltrimethoxysilane, pentadecyltriethoxysilane, hexadecyltrimethoxysilane, hexadecyltroethoxysilane, heptadecyltrimethoxysilane, heptadecyltriethoxysilane, octadecyltrimethoxylsilane octadecyltriethoxysilane, nonadecyltrimethoxysilane, and nonadecyltriethoxysilane.

After formation of the SAM layer (e.g., SAM1 in FIG. 4B and SAM2 in FIG. 5B), the patterned substrates may undergo subsequent processes, such as ALD deposition to deposit a thin film on portions of the patterned substrate that are not already coated with an underlying SAM layer. For instance, SAM1 was deposited on metal surfaces 410 in FIG. 4B, leaving dielectric surfaces 420 exposed to be coated by ALD deposited thin film 430 as shown in FIG. 4C. In another example, SAM2 was deposited on dielectric surfaces 520 in FIG. 5B, leaving metal surfaces 510 exposed to be coated by ALD deposited thin film 530 as shown in FIG. 5C.

In one embodiment, the process chamber 104 is a SAM treatment chamber utilized to perform SAM treatment processes (e.g., SAM deposition and annealing as described in further detailed hereinbelow). The process chamber 104 is configured to enable vapor phase SAM molecules to selectively adsorb to one material of a substrate preferentially rather than to another material of the substrate. The selective adsorption is generally controlled by the reactivity of the SAM molecule headgroup and the surface termination characteristics/functional groups disposed on the substrate surface. For example, a patterned substrate having exposed $SiO_2$ dielectric material and Cu metallic materials which are exposed to the same SAM treatment process will result in SAM molecules that are selective to metals bonding to the Cu preferentially with substantially no adsorption on the $SiO_2$ material. For instance, the low vapor pressure OM may be octadecylphosphonic acid (ODPA). The ODPA has inherent chemical affinity to metal surfaces and will form a SAM on the Cu surfaces but not on the $SiO_2$ surfaces. Upon formation of a SAM layer on the Cu surface, the resulting SAM layer will exhibit a high water contact angle (i.e. greater than about 105° measured ex situ) which indicates the formation of a dense SAM. In comparison, the water contact angle of the $SiO_2$ surface will remain below 100° (e.g., about 40-50°), being indicative of the absence of a SAM layer on the dielectric surface.

After SAM formation, the SAM treated patterned substrate surface may be exposed to further processing, such as atomic layer deposition (ALD), in a further processing chamber (such as processing chamber 106). During ALD, two precursors are separately and sequentially delivered in the vapor phase to the patterned surface, as explained in further detail below. The reaction of these precursors forms a thin film on portions of the patterned substrate surface that do not have a pre-existing SAM layer. ALD layers do not form on surfaces that have a contact angle greater than about 100°, greater than about 105°, and greater than about 110° C. Portions of the patterned substrate surface that have a SAM successfully deposited thereon have a contact angle within these ranges such that the ALD layer is not deposited thereon. In this manner, the ALD process may be used to selectively deposit a thin film coating on a surface of the substrate that does not have a SAM deposited thereon since as explained above surfaces that are coated with a SAM will have a water contact angle of greater than 105°.

In one embodiment, the process chamber 108 is a post-process chamber, such as an anneal or bake chamber. In another embodiment, the process chamber 108 is a plasma processing chamber. In one example, the process chamber 108 enables SAM material removal from the substrate by thermal desorption or exposure to a plasma, such as an oxygen and/or hydrogen containing plasma. Alternatively or in combination, the process chamber 108 may be utilized for ALD clean up processes. For example, for an imperfect SAM treatment, some ALD nucleation may occur on defect sites of the substrate which are not covered by SAM materials. The process chamber 108 may be utilized to perform an etch process to etch exposed ALD materials which results in removal of the ALD films grown on the defect sites while only removing a small amount of material from the intended ALD growth location.

The transfer chamber 110, which enables transfer of the substrate between the process chambers 102, 104, 106, 108, houses a transfer robot 114 therein. The transfer robot 114 may be a single blade robot or a dual blade robot as illustrated. The dual blade robot 114 has a pair of substrate transport blades 116A, 116B attached to distal ends of a pair of extendable arms. The blades 116A, 116B are used to support and carry individual substrates between the chambers 102, 104, 106, 108. The transfer chamber 110 is also maintained under vacuum or an otherwise reduced oxygen environment. Air exposure of the substrate between SAM treatment and ALD treatment is potentially detrimental to the effectiveness of the SAM material for ALD blocking and transferring the substrate between the process chamber 104 and the process chamber 106 in-situ provides for improved processing performance, such as higher deposition selectivity. In certain embodiments, the substrates may undergo cyclic SAM and ALD processes. In such embodiments and others, the transfer chamber enables efficient transfer of substrates between the process chambers 104, 106 while also improving the processing performance by preventing exposure of the substrate to an ambient air environment. The transfer chamber 110 is shown with a particular configuration and with a particular transfer robot 114 therein. However, it should be understood that many different types of transfer chambers may be used, which may have a square shape, rectangular shape, hexagonal shape, heptagonal shape, octagonal shape, or other shape. The transfer robot 114 may also have many different configurations, which may include one, two, three or more robot arms.

Figure 2:
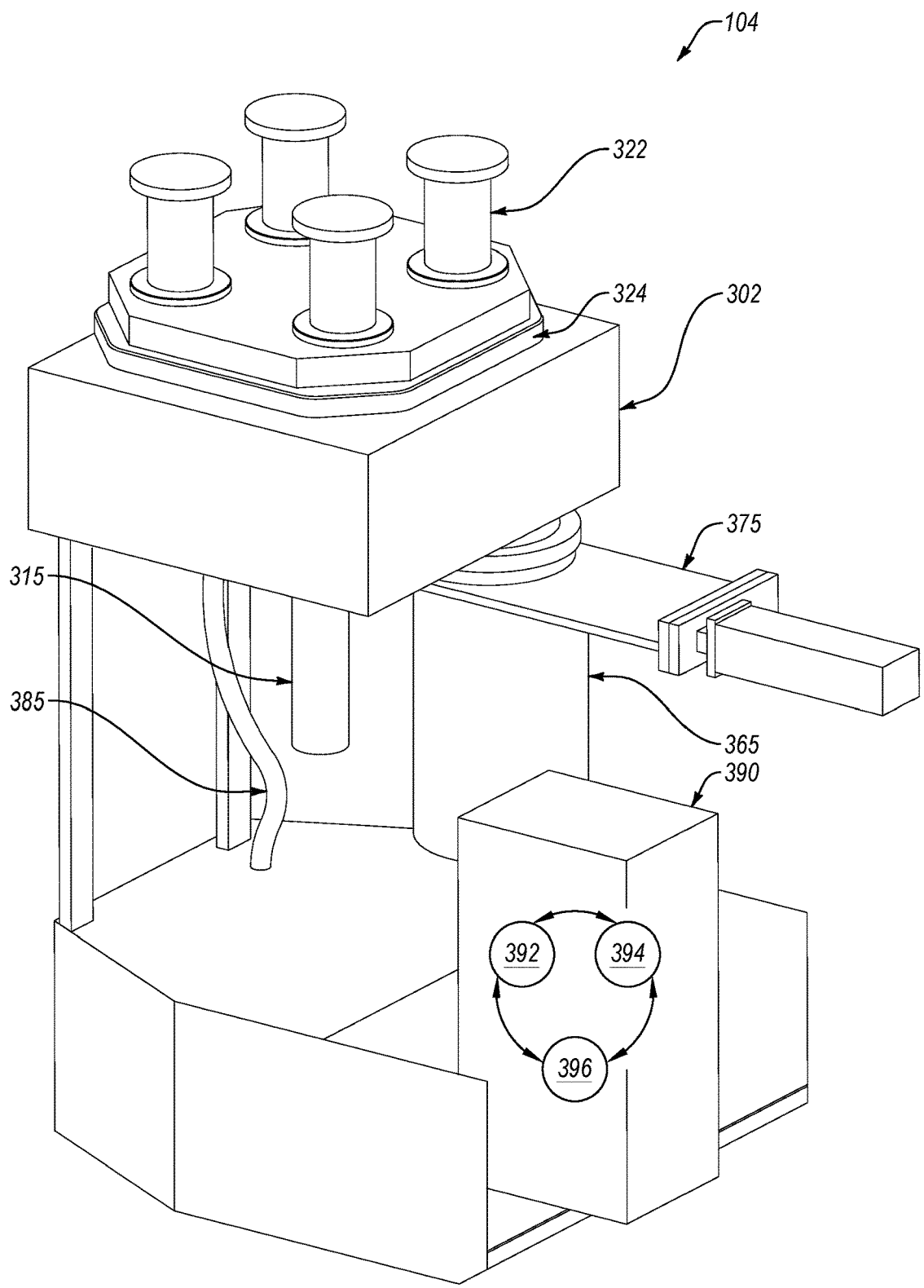
FIG. 2 depicts a perspective view of a processing chamber, according to certain embodiments.
Figure 3:
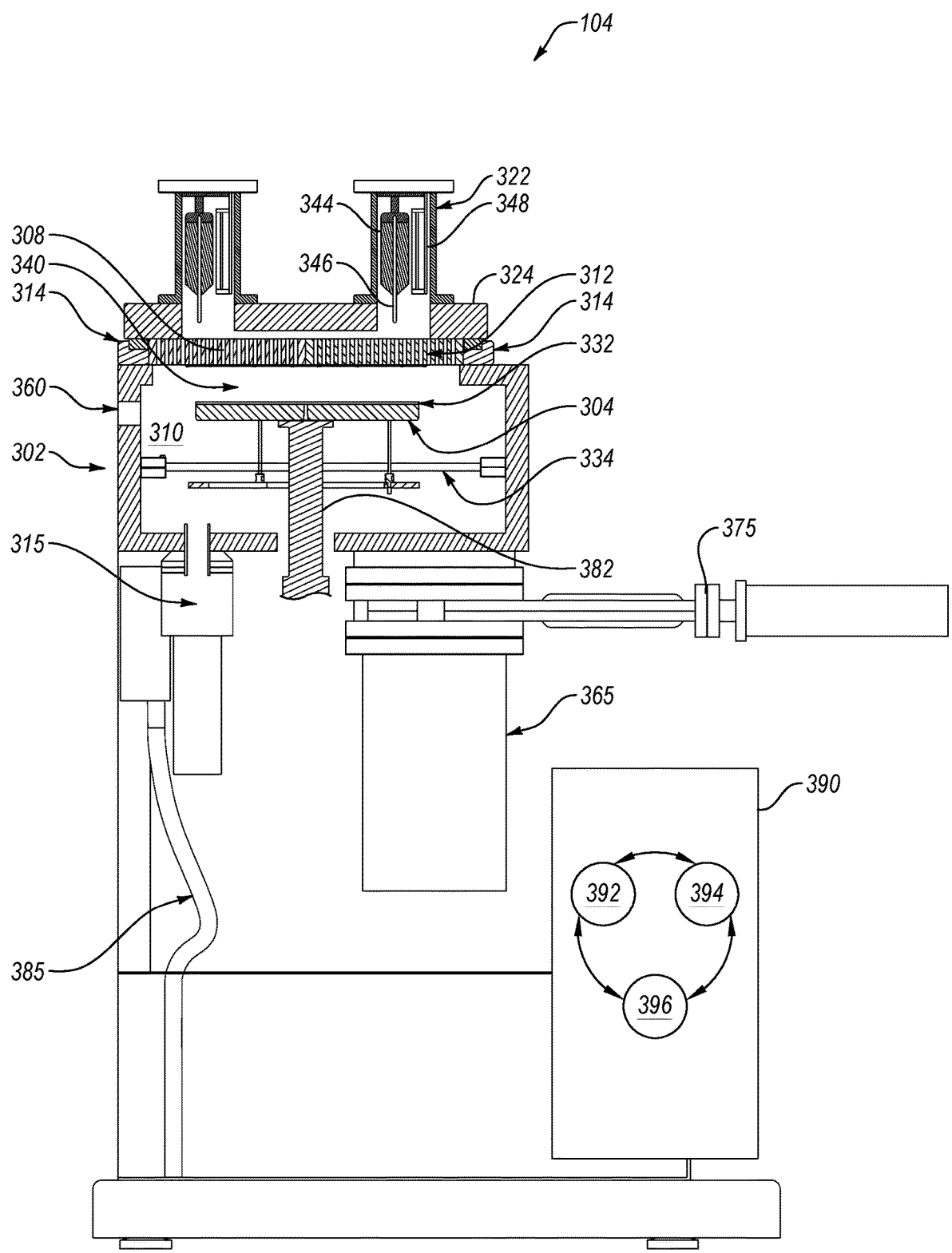
FIG. 3 depicts a cross-sectional view of a processing chamber, according to certain embodiments.

FIG. 2 depicts a perspective view of a processing chamber 104, according to certain embodiments. FIG. 3 depicts a cross-sectional view of a processing chamber 104, according to certain embodiments. The processing chamber 104 includes a chamber body 302 and a lid plate 324. The chamber body 302 and lid plate 324 together define an interior volume 310 of the processing chamber. The interior volume 310 of the processing chamber include a substrate support 304, a first heater 332, and a second heater 334 disposed therein. The substrate support 304 is configured to support a substrate during processing.

Processing chamber 104 further includes a showerhead 312 disposed above the substrate support 304. The lid plate 324 is coupled to the showerhead 312 and supported by the chamber body 302. An adapter backing plate 314 is disposed between the showerhead 312 and the lid plate 324 and is configured to adjust the lid plate 324 height. The first heater 332 is disposed in the interior volume 310 of the processing chamber 104 between the showerhead 312 and the substrate support 304.

The first heater 332 may be a rotating heater, in one embodiment. The rotating heater may include a heating member disposed inside the substrate support 304. The heating member may be a resistive heater and may be disposed within the substrate support 304 in any desirable orientation. The heating member may be coupled to a shaft disposed in shaft 382 which is coupled to the substrate support 304. The shaft of the heating member may be configured to rotate the heating member.

The first heater 332 is configured to provide temperature control during self-assembled monolayer (SAM) deposition. The second heater 334 is also disposed in the interior volume 310 of the processing chamber 104. The second heater 334 may be a lamp assembly or other light-based heater in one embodiment. For instance, the second heater 334 may include four lamps, each lamp positioned proximate and/or along one of four chamber walls, and each of the lamps may be coupled to each other. The second heater 334 (e.g., lamp assembly) is configured to provide temperature control during SAM annealing.

The lid plate 324 supports at least one thermal evaporator 322. In certain embodiments, lid plate 324 supports four evaporators 322. In one embodiment, each of four thermal evaporators 322 is positioned at one corner of four discrete corners of the lid plate 324.

Each thermal evaporator 322 holds an organic molecule (OM) (e.g., a low vapor pressure OM) in a crucible 344 with line of sight to the interior volume 310 of the processing chamber and particularly to the substrate support 304. The evaporator 322 is configured to convert OM precursors to a vapor to be supplied to the processing region 340 defined between the substrate support 304 and the showerhead 312. In embodiments where the lid plate 324 supports four thermal evaporators, each thermal evaporator 322 is configured to deliver a portion (e.g., a quarter) of a total amount of the OM precursor (i.e., SAM precursor gas), via a portion of a showerhead (e.g., a quarter of a showerhead) to a portion of the processing region 340 (e.g., a quarter of the processing region). In this embodiment, the four evaporators, together, are configured to deliver the total amount of the OM precursor to the processing region via the showerhead. Using a plurality of evaporators to deliver the OM piecemeal (or in four separate zones) to the substrate provides for greater uniformity of the SAM deposition relative to use of a single evaporator. An illustrative depiction of showerhead 312 composed of four zones and coupled to a lid plate 324 is shown and described with respect to FIG. 8A below.

The low vapor pressure OM precursors are held in a boat, e.g., a tungsten boat (not shown) which is heated by electric current. This forms OM vapors which flow through crucible 344, into processing region 340, and out of interior volume 310 via exhaust line 315. The crucible 344 has a shutter 346 over the opening of the crucible 344, which defines the flux of the OM vapors through processing region 340 and to the substrate positioned on the substrate support 304.

During SAM processing, the substrate is positioned on the substrate support 304 with the substrate's patterned surface facing the crucible opening. The OM precursors may be solid or liquid at room temperature and heated to form OM vapors. A heating element 348 may be positioned within the evaporator 322 adjacent to the crucible 344 to vaporize the OM precursors and to maintain elevated temperature along the pathway of the OM vapors from the precursor delivery system to processing region 340 so as to minimize condensation of the OM vapors along its path to the substrate. The heating element 348 may be, for example, a lamp, a light emitting diode, a laser, a resistive heater, or any suitable heater. In one embodiment, the heating element heats the evaporator such that the precursor reaches a temperature of from any of about 100° C., about 150° C., about 200° C., about 250° C., about 300° C. to any of about 350° C., about 400° C., about 450° C., about 500° C., about 550° C., or about 600° C.

A pressure control unit is coupled to the processing chamber 104 in communication with the interior volume 310 to control the pressure in the interior volume 310. The pressure control unit includes an exhaust port 315, a turbo/cryo pump 365, a throttle valve 375 (e.g., a throttle ISO valve), a rough line 385, any other suitable pressure control unit, or a combination thereof. The gas pressure within interior volume 310 may be monitored by a pressure sensor (not shown).

A controller 390 is coupled to processing chamber 104. The controller 390 includes a central processing unit (CPU) 392, a memory 394, and support circuits 396. The controller 390 is utilized to control a rate of gas supplied by the evaporator 322 to the processing region 340 and/or the temperature of the interior processing volume 310 via first heater 332 and second heater 334 and/or the pressure of the interior processing volume 310 via the pressure control unit. The CPU 392 may be of any form of a general purpose computer processor that can be used in an industrial setting. The software routines can be stored in the memory 394, such as random access memory, read only memory, floppy or hard disk drive, or other form of digital storage. The support circuits 396 are conventionally coupled to the CPU 392 and may comprise cache, clock circuits, input/output subsystems, power supplies, and the like. The software routines, when executed by the CPU 392, transform the CPU 392 into a specific purpose computer (controller) 390 that controls the processing chamber 104 such that the processes are performed in accordance with the present disclosure. The software routines may also be stored and/or executed by a second controller (not shown) that is located remotely from the chamber.

The chamber body 302 may be manufactured from a material suitable to withstand temperatures of up to about 600° C., about 500° C., about 400° C., or about 300° C. For example, the chamber body 302 may be formed from aluminum, alloys thereof, stainless steel, and other suitable metallic materials. A slit valve opening 360 is formed in the chamber body 302 to allow for ingress and egress of a substrate to and from the process volume 310. A slit valve door (not shown) is coupled to the chamber body 302 and may be moveable to seal and unseal the slit valve opening 360. In one embodiment, the slit valve door is formed from the same materials as the chamber body 302. Alternatively, the slit valve door may be formed from materials different form the chamber body 302.

The substrate support 304 may be moveably disposed within the interior process volume 310. The substrate support 304 may be elevated (with an actuator coupled to shaft 382 for instance) to reach a processing position or lowered such that a substrate supporting surface of the substrate support 304 is coplanar with or below the slit valve opening 360 to allow for positioning of a substrate on the substrate support 304. The substrate support 304 may be formed from a material suitable for operation at elevated processing temperatures and may be a metallic material, a ceramic material, or combinations thereof. For example, the pedestal may be formed from aluminum, aluminum alloys, stainless steel, or ceramic materials, such as aluminum oxide or aluminum nitride.

The substrate support 304 may have a heating member disposed therein and the heating member may be coupled to a power source (not shown). In one embodiment, the heating member may be the same as the first heating element 332. The power source may also provide power for raising and lowering the substrate support 304 within the interior process volume 310. The power source may similarly provide power to other heaters in the processing chamber 104 (e.g., the second heater 334, and/or heating element 348, and the like). The heating member (which may be the same as the first heating element 332) may be a resistive heater and may be disposed within the substrate support 304 in any desirable orientation. For example, the heating member may be formed in the substrate support 304 in a spiral orientation or other suitable orientation configured to heat the substrate support uniformly. In one embodiment, the heating member is configured to heat the substrate support 304 to a temperature from any of about 100° C., about 150° C., about 200° C., about 250° C., about 300° C. to any of about 350° C., about 400° C., about 450° C., about 500° C., about 550° C., or about 600° C., such as, for instance, between about 100° C. and about 500° C., between about 150° C. and about 300° C.

The showerhead 312, which is disposed above the substrate support 304, is coupled directly or indirectly to and supported by the chamber body 302. The showerhead 312 may be formed from materials similar to the materials utilized for the substrate support 304. The showerhead 312 has a plurality of first passages 308 formed therein. The first passages 308 enable fluid communication and the transfer of vapor from the evaporator 322 to processing region 340 via direct line-of-sight.

Figure 8A:
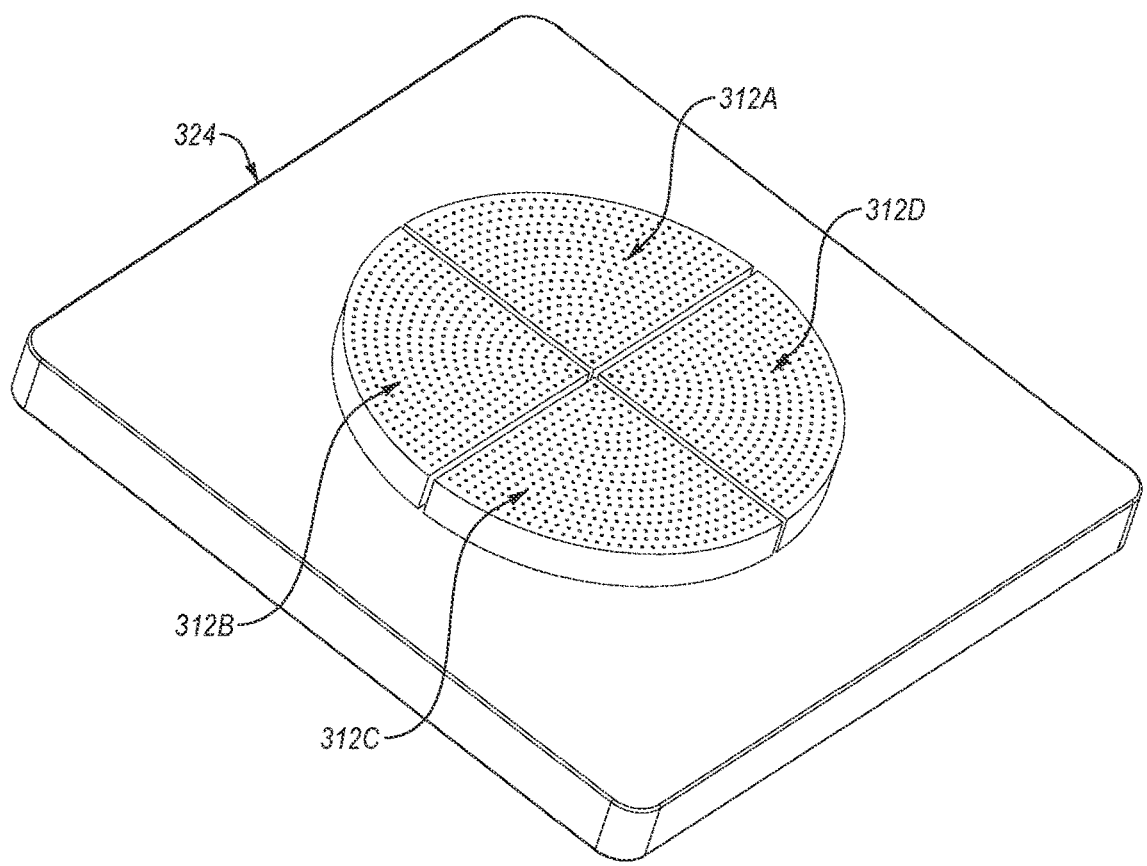
FIG. 8A provides an exemplary schematic depiction of a bottom side of showerhead that includes four portions, coupled to a lid plate, according to certain embodiments.
Figure 8B:
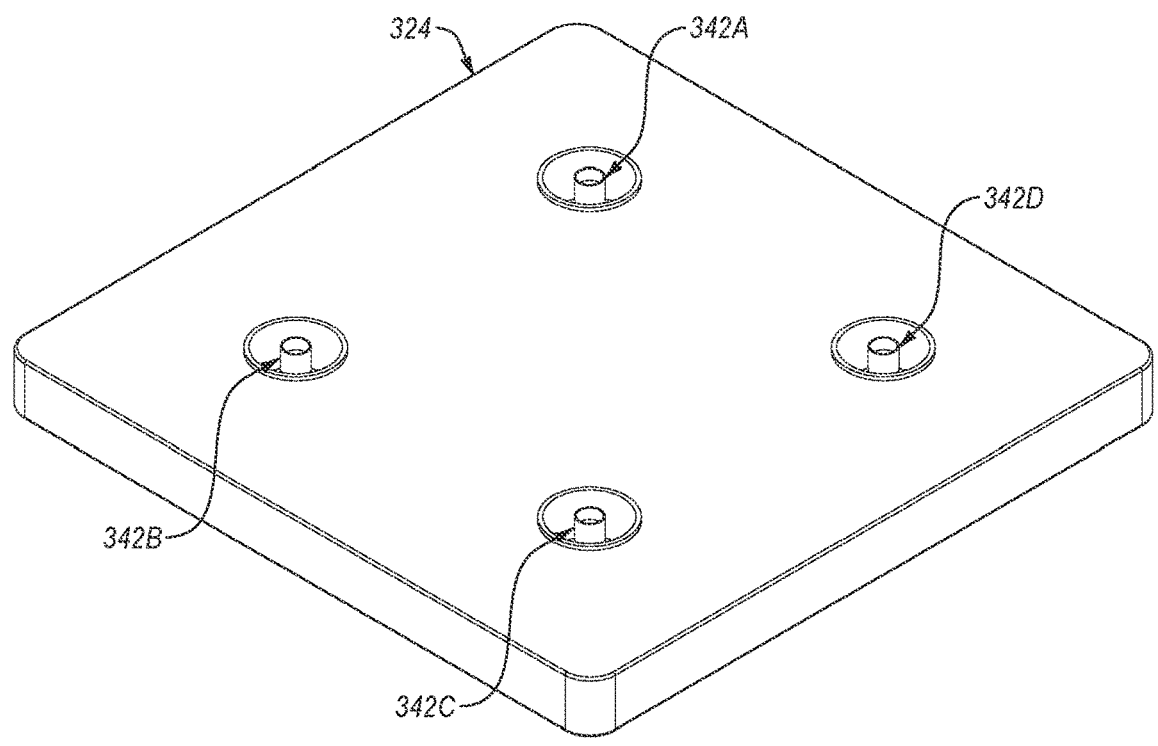
FIG. 8B provides an exemplary schematic depiction of a top side of a lid plate that includes four connection configured to couple to four evaporators, according to certain embodiments.

In certain embodiments, the showerhead 312 includes four portions where each portion is positioned above a quarter of the processing region 340, forming four processing zones, and below one of four evaporators 322. FIG. 8A provides an exemplary depiction of a bottom perspective view of a showerhead that includes four portions (312A, 312B, 312C, and 312D). The showerhead in FIG. 8A is shown as being coupled to lid plate 324. FIG. 8B provides an exemplary depiction of a top perspective view of a lid plate 324 having four connection points 342A, 342B, 342C, and 342D, where each connection point is used to couple to one of four evaporators 322. In this manner, each evaporator 322 delivers a portion of the total amount of vaporized OM precursor materials that ultimately get delivered to one of four zones of the processing region 340. In operation, each evaporator 322 delivers a portion of the total amount of vaporized OM precursor material through a plurality of passages 308 in the underlying portion 312A, 312B, 312C, 312D of showerhead 312.

During processing, the evaporator 322, the showerhead passages 308, and processing region 340 are maintained at elevated temperature (e.g., through the first heater 332, the crucible heating element 348, a showerhead heater, and so on) to maintain the OM precursor in a vapor state. After deposition of OM vapors onto the substrate (also referred to as SAM deposition), the remaining vaporized materials and other effluent are removed from the process volume 310 through the exhaust 315.

The OM precursor is typically a hydrocarbon of varying chain length, e.g., containing greater than 4 and fewer than 30 carbon atoms, with a functionalized head group, and optionally a functionalized tail group. The head group may include phosphonates, alkylsilanes, alkoxysilanes, and chlorosilanes. Depending on the functionalized head group, the SAM forms either on exposed metal surfaces of the patterned substrate or on exposed dielectric surfaces of the patterned substrate as explained in further detail above with respect to FIGS. 4A-4C and 5A-5C.

During SAM deposition, the interior process volume 310 remains at low pressure and low temperature, as explained in further detail below with respect to FIG. 7. The pressure of interior volume 310 is controlled by opening throttle valve 375 and utilizing turbo/cryo pump 365. The pressure during SAM deposition may be isobaric or non-isobaric. The temperature of interior volume 310 during SAM deposition is controlled by first heater 332 and may be isothermal or non-isothermal. After SAM deposition, the pressure and temperature in interior process volume 310 are increased to prepare processing chamber 104 for SAM annealing, as explained in further detail below with respect to FIG. 7. The pressure of interior volume 310 is controlled by closing throttle valve 375 and using the rough line 385 to increase the pressure. The pressure during SAM annealing may be isobaric or non-isobaric. The temperature of interior volume 310 during SAM annealing is controlled with second heater 334 and may be isothermal or non-isothermal. The entire SAM treatment process (generation of OM vapors, SAM deposition, and SAM annealing) is performed in a single chamber. After SAM treatment, the SAM treated substrate may transfer from processing chamber 104 to processing chamber 106 via transfer chamber 110 to undergo further processing.

Figure 6:
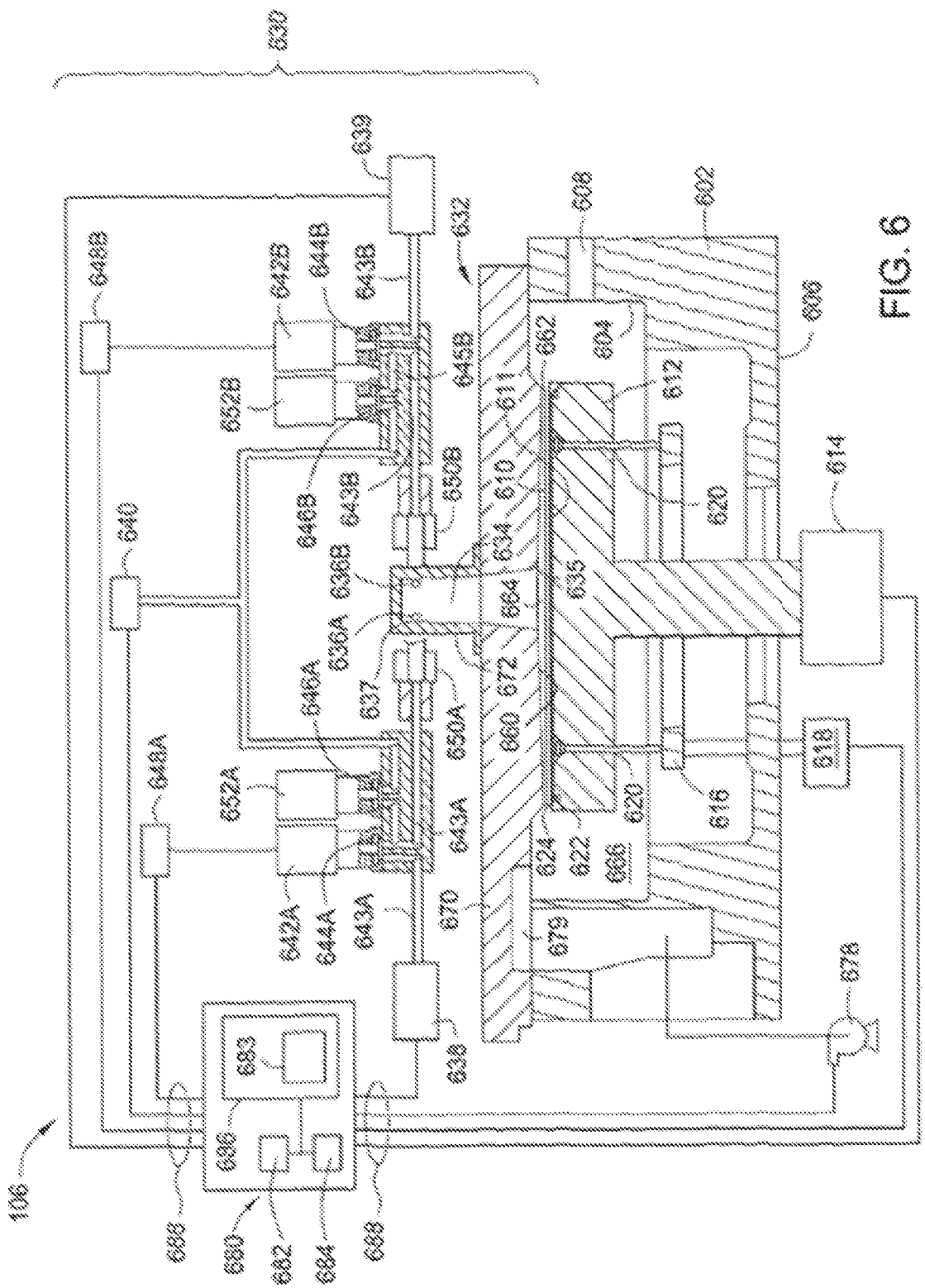
FIG. 6 depicts a cross-sectional view of an exemplary ALD processing chamber.

FIG. 6 illustrates a schematic, cross-sectional view of the process chamber 106 according to one embodiment described herein. The process chamber 106 includes a gas delivery system 630 adapted for ALD or sequential layer deposition. The process chamber 106 contains a chamber body 602 having sidewalls 604 and a bottom 606. A slit valve 608 provides ingress and egress of a substrate 610, to and from the process chamber 106.

A substrate support 612 supports the substrate 610 on a substrate receiving surface 611. The substrate support 612 is mounted to a lift motor 614 to raise and lower the substrate support 612 and the substrate 610 disposed thereon. A lift plate 616 connected to a lift motor 618 is mounted in the process chamber 106 and raises and lowers lift pins 620 movably disposed through substrate support 612. The lift pins 620 raise and lower the substrate 610 over the surface of substrate support 612. The substrate support 612 may include a vacuum chuck (not shown), an electrostatic chuck (not shown), or a clamp ring (not shown) for securing the substrate 610 to the substrate support 612 during processing.

The substrate support 612 may be heated to heat the substrate 610 disposed thereon. For example, the substrate support 612 may be heated using an embedded heating element, such as a resistive heater (not shown), or may be heated using radiant heat, such as heating lamps (not shown) disposed above the substrate support 612. A purge ring 622 may be disposed on the substrate support 612 to define a purge channel 624 which provides a purge gas to a peripheral portion of the substrate 610 to prevent deposition thereon.

A gas delivery system 630 is disposed at an upper portion of the chamber body 602 to provide a gas, such as a process gas and/or a purge gas, to the process chamber 106. A vacuum system 678 is in communication with a pumping channel 679 to evacuate any desired gases from the process chamber 106 and to help maintain a desired pressure or a desired pressure range inside a pumping zone 666 of the process chamber 106.

In one embodiment, the gas delivery system 630 contains a chamber lid assembly 632. The chamber lid assembly 632 includes an expanding channel 634 extending from a central portion of chamber lid assembly 632 and a lower surface 660 extending from the expanding channel 634 to a peripheral portion of the chamber lid assembly 632. A lower surface 660 is sized and shaped to substantially cover the substrate 610 disposed on the substrate support 612. The expanding channel 634 has gas inlets 636A, 636B to provide gas flows from two similar pairs of valves 642A/652A, 642B/652B, which may be provided together and/or separately.

In one configuration, valve 642A and valve 642B are coupled to separate reactant gas sources but may also be coupled to the same purge gas source. For example, valve 642A is coupled to reactant gas source 638 and valve 642B is coupled to reactant gas source 639, and both valves 642A, 642B are coupled to purge gas source 640. Each valve 642A, 642B includes a delivery line 643A, 643B having a valve seat assembly 644A, 644B and each of valves 652A, 652B includes a purge line 645A, 645B having a valve seat assembly 646A, 646B. Delivery line 643A, 643B is in fluid communication with the reactant gas source 638, 639 and is in fluid communication with gas inlet 636A, 636B of the expanding channel 634. The valve seat assembly 644A, 644B of delivery line 643A, 643B controls the flow of the reactant gas from the reactant gas source 638, 639 to the expanding channel 634. Purge line 645A, 645B is in fluid communication with purge gas source 640 and intersects delivery line 643A, 643B downstream of valve seat assembly 644A, 644B of delivery line 643A, 643B. Valve seat assembly 646A, 646B of purge line 645A, 645B controls the flow of the purge gas from purge gas source 640 to the expanding channel 634. If a carrier gas is used to deliver reactant gases from the reactant gas source 638, 639, preferably the same gas is used as a carrier gas and a purge gas (i.e., an argon gas used as a carrier gas and a purge gas).

Each valve seat assembly 644A, 644B, 646A, 646B may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 648A, 648B may be coupled to valves 642A, 642B to control actuation of the diaphragms of the valve seat assemblies 644A, 644B, 646A, 646B of valves 642A, 642B. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 642A, 642B may be a zero dead volume valve to enable flushing of a reactant gas from delivery line 643A, 643B when valve seat assembly 644A, 644B is closed. For example, purge line 645A, 645B may be positioned adjacent valve seat assembly 644A, 644B of delivery line 643A, 643B. When valve seat assembly 644A, 644B is closed, purge line 645A, 645B may provide a purge gas to flush delivery line 643A, 643B. In the embodiment shown, purge line 645A, 645B is positioned slightly spaced from the valve seat assembly 644A, 644B of delivery line 643A, 643B so that a purge gas is not directly delivered into valve seat assembly 644A, 644B when open. A zero dead volume valve as used herein is defined as a valve which has negligible dead volume (i.e., not necessary zero dead volume).

Each valve pair 642A/652A, 642B/652B may be adapted to provide a combined gas flow and/or separate gas flows of the reactant gas and the purge gas. In reference to valve pair 642A/652A, one example of a combined gas flow of the reactant gas and the purge gas includes a continuous flow of a purge gas from purge gas source 640 through purge line 645A and pulses of a reactant gas from reactant gas source 638 through delivery line 643A. The continuous flow of the purge gas may be provided by leaving the diaphragm of valve seat assembly 646A of the purge line 645A open. The pulses of the reactant gas from reactant gas source 638 may be provided by opening and closing the diaphragm of valve seat assembly 644A of delivery line 643A. In reference to valve pair 642A/652A, one example of separate gas flows of the reactant gas and the purge gas includes pulses of a purge gas from purge gas source 640 through purge line 645A and pulses of a reactant gas from reactant gas source 638 through delivery line 643A. The pulses of the purge gas may be provided by opening and closing the diaphragm of valve seat assembly 646A of purge line 645A. The pulses of the reactant gas from reactant gas source 638 may be provided by opening and closing the diaphragm of valve seat assembly 644A of delivery line 643A.

Delivery lines 643A, 643B of valves 642A, 642B may be coupled to gas inlets 636A, 636B through gas conduits 650A, 650B. Gas conduits 650A, 650B may be integrated or may be separate from valves 642A, 642B. In one aspect, valves 642A, 642B are coupled in close proximity to expanding channel 634 to reduce any unnecessary volume of delivery line 643A, 643B and gas conduits 650A, 650B between valves 642A, 642B and gas inlets 636A, 636B.

The expanding channel 634 contains a channel which has an inner diameter which increases from an upper portion 637 to a lower portion 635 of expanding channel 634 adjacent lower surface 660 of chamber lid assembly 632. In one embodiment, expanding channel 634 may be shaped as a truncated cone (including shapes resembling a truncated cone). Whether a gas is provided toward the walls of expanding channel 634 or directly downward towards substrate 610, the velocity of the gas flow decreases as the gas flow travels through expanding channel 634 due to the expansion of the gas. The reduction of the velocity of the gas flow helps reduce the likelihood the gas flow will blow off reactants adsorbed on the surface of substrate 610.

Not wishing to be bound by theory, it is believed that the diameter of expanding channel 634, which is gradually increasing from upper portion 637 to lower portion 635 of expanding channel 634, allows less of an adiabatic expansion of a gas through expanding channel 634 which helps to control the temperature of the gas. For instance, a sudden adiabatic expansion of a gas delivered through gas inlet 636A, 636B into expanding channel 634 may result in a drop in the temperature of the gas which may cause condensation of the gas and formation of droplets. On the other hand, a gradually expanding channel 634 is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 632). The gradually expanding channel 634 may contain one or more tapered inner surfaces, such as a tapered straight surface, a concave surface, a convex surface, or combinations thereof or may contain sections of one or more tapered inner surfaces (i.e., a portion tapered and a portion non-tapered).

In one embodiment, gas inlets 636A, 636B are located adjacent upper portion 637 of expanding channel 634. In other embodiments, one or more gas inlets 636A, 636B may be located along the length of expanding channel 634 between upper portion 637 and lower portion 635.

At least a portion of lower surface 660 of chamber lid assembly 632 may be tapered from expanding channel 634 to a peripheral portion of chamber lid assembly 632 to help provide an improved velocity profile of a gas flow from expanding channel 634 across the surface of substrate 610 (i.e., from the center of the substrate to the edge of the substrate). Lower surface 660 may contain one or more tapered surfaces, such as a straight surface, a concave surface, a convex surface, or combinations thereof. In one embodiment, lower surface 660 is tapered in the shape of a funnel.

A choke 662 may be located at a peripheral portion of chamber lid assembly 632 adjacent the periphery of substrate 610. Choke 662, when chamber lid assembly 632 is assembled to form a processing zone around substrate 610, contains any member restricting the flow of gas therethrough at an area adjacent the periphery of substrate 610. In one embodiment, the spacing between choke 662 and substrate support 612 is between about 0.04 inches and about 2.0 inches, and preferably between 0.04 inches and about 0.2 inches. The spacing may vary depending on the gases being delivered and the process conditions during deposition. Choke 662 helps provide a more uniform pressure distribution within the volume or reaction zone 664 defined between chamber lid assembly 632 and substrate 610 by isolating reaction zone 664 from the non-uniform pressure distribution of pumping zone 666.

In one aspect, since reaction zone 664 is isolated from pumping zone 666, a reactant gas or purge gas needs only adequately fill reaction zone 664 to ensure sufficient exposure of substrate 610 to the reactant gas or purge gas. Process chamber 106 sequentially introduces reactants to the surface of substrate 610 to provide absorption of alternating thin layers of the reactants onto the surface of substrate 610. As a consequence, atomic layer deposition does not require a flow of a reactant which reaches the surface of substrate 610 simultaneously. Instead, a flow of a reactant can be provided in an amount which is sufficient to adsorb a thin layer of the reactant on the surface of substrate 610.

Chamber lid assembly 632 may include cooling elements and/or heating elements depending on the particular gas being delivered therethrough. Controlling the temperature of chamber lid assembly 632 may be used to prevent gas decomposition, deposition, or condensation on chamber lid assembly 632. For example, water channels (not shown) may be formed in chamber lid assembly 632 to cool chamber lid assembly 632. In another example, heating elements (not shown) may be embedded or may surround components of chamber lid assembly 632 to heat chamber lid assembly 632. In one embodiment, components of chamber lid assembly 632 may be individually heated or cooled. For example, chamber lid assembly 632 may contain lid plate 670 and lid cap 672 in which lid plate 670 and lid cap 672 form expanding channel 634. Lid cap 672 may be maintained at one temperature range and lid plate 670 may be maintained at another temperature range. For example, lid cap 672 may be heated by being wrapped in heater tape or by using another heating device to prevent condensation of reactant gases and lid plate 670 may be maintained at ambient temperature. In another example, lid cap 672 may be heated and lid plate 670 may be cooled with water channels formed therethrough to prevent thermal decomposition of reactant gases on lid plate 670.

Chamber lid assembly 632 contains components that may be made of stainless steel, aluminum, nickel-plated aluminum, nickel, or other suitable materials compatible with the processing to be performed. In one embodiment, lid cap 672 contains aluminum or stainless steel and lid plate 670 contains aluminum.

Control unit 680, such as a programmed personal computer, work station computer, or the like, may be coupled to the process chamber 106 to control processing conditions. For example, control unit 680 may be configured to control flow of various process gases and purge gases from gas sources 638, 639, and 640 through valves 642A, 642B during different stages of a substrate process sequence. Illustratively, the control unit 680 contains central processing unit (CPU) 682, support circuitry 684, and memory 686 containing associated control software 683.

The control unit 680 may be one of any form of general purpose computer processor that can be used in an industrial setting for controlling various chambers and sub-processors. The CPU 682 may use any suitable memory 686, such as random access memory, read only memory, floppy disk drive, hard disk, or any other form of digital storage, local or remote. Various support circuits may be coupled to the CPU 682 for supporting process chamber 106. The control unit 680 may be coupled to another controller that is located adjacent individual chamber components, such as programmable logic controllers 648A, 648B of valves 642A, 642B. Bi-directional communications between the control unit 680 and various other components of process chamber 106 are handled through numerous signal cables collectively referred to as signal buses 688. In addition to control of process gases and purge gases from gas sources 638, 639, 640 and from programmable logic controllers 648A, 648B of valves 642A, 642B, control unit 680 may be configured to be responsible for automated control of other activities used in wafer processing-such as wafer transport, temperature control, chamber evacuation, among other activities.

In operation, the substrate 610 is delivered to the process chamber 106 through the slit valve 608 by a robot (not shown), such as the transfer robot 114 (FIG. 1). Substrate 610 is positioned on substrate support 612 through cooperation of the lift pins 620 and the robot. Substrate support 612 raises substrate 610 into close opposition to lower surface 660 of chamber lid assembly 632. A first gas flow may be injected into expanding channel 634 of process chamber 106 by valve 642A together or separately (i.e., pulses) with a second gas flow injected into process chamber 106 by valve 642B. The first gas flow may contain a continuous flow of a purge gas from purge gas source 640 and pulses of a reactant gas from reactant gas source 638 or may contain pulses of a reactant gas from reactant gas source 638 and pulses of a purge gas from purge gas source 640. The second gas flow may contain a continuous flow of a purge gas from purge gas source 640 and pulses of a reactant gas from reactant gas source 639 or may contain pulses of a reactant gas from reactant gas source 639 and pulses of a purge gas from purge gas source 640. The gas flow travels through expanding channel 634 as a pattern of vortex flow which provides a sweeping action across the inner surface of expanding channel 634. The pattern of vortex flow dissipates to a downwardly flow toward the surface of substrate 610. The velocity of the gas flow reduces as it travels through expanding channel 634. The gas flow then travels across the surface of substrate 610 and across lower surface 660 of chamber lid assembly 632. Lower surface 660 of chamber lid assembly 632, which is downwardly sloping, helps reduce the variation of the velocity of the gas flow across the surface of substrate 610. The gas flow then travels by choke 662 and into pumping zone 666 of process chamber 106. Excess gas, by-products, etc. flow into the pumping channel 679 and are then exhausted from process chamber 106 by vacuum system 678. In one aspect, the gas flow proceeds through expanding channel 634 and between the surface of substrate 610 and lower surface 660 of chamber lid assembly 632 in a laminar manner which aids in uniform exposure of a reactant gas to the surface of substrate 610 and efficient purging of inner surfaces of chamber lid assembly 632.

The processing chamber 106 is described with a particular configuration and with a particular architecture. However, it should be understood that many different types of ALD processing chambers may be used. For instance, the ALD chamber may have a funnel lid in one embodiment or a dual channel showerhead lid in another embodiment.

Figure 7:
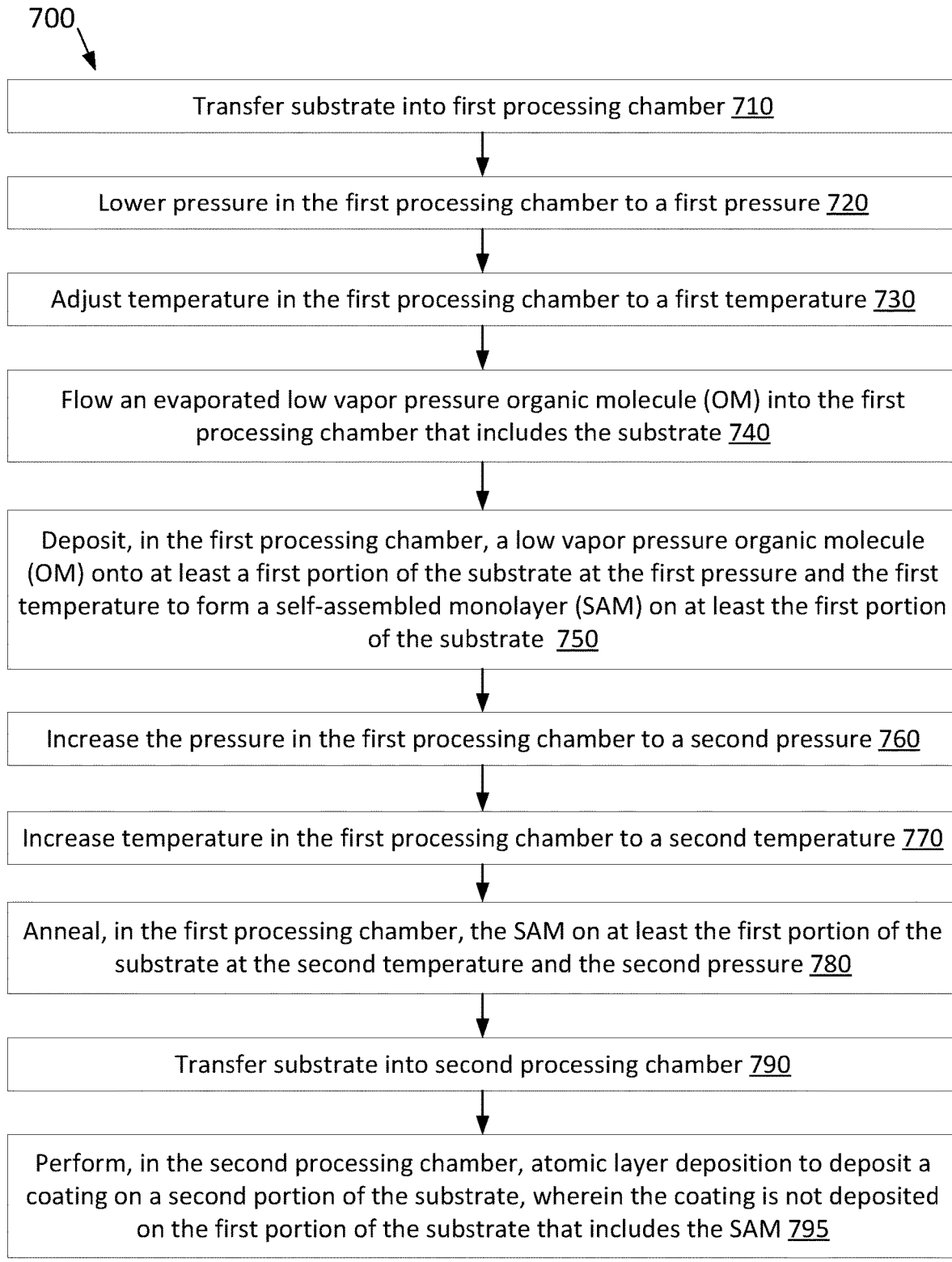
FIG. 7 depicts a substrate processing method, according to certain embodiments.

FIG. 7 illustrates operations of a method 700 for processing a substrate according to one embodiment described herein. A substrate enters a substrate processing system (such as system 100) via load lock chamber 112. Thereafter, a transfer chamber robot, such as transfer chamber robot 114 in FIG. 1, transfers the substrate from load lock chamber 112 to a processing chamber. In one embodiment, transfer chamber robot 114 transfers the substrate from load lock chamber 112, via transfer chamber 110, and into processing chamber 102. A pre-clean process is performed on the substrate in process chamber 102.

At operation 710, a substrate is transferred into a first processing chamber, such as first processing chamber 104, described with respect to FIGS. 2-3, to undergo SAM treatment (e.g., SAM deposition and SAM annealing). In embodiments where the substrate is pre-cleaned prior to SAM deposition, the substrate is transferred from process chamber 102 to process chamber 104 via the transfer chamber 110 and with the assistance of transfer chamber robot 114.

Method 700 includes, prior to initiating SAM deposition, lowering the pressure in the first processing chamber to a first pressure (720). The first pressure ranges from any of about 1·E-7 Torr or about 1·E-6 Torr to any of about 1·E-5 Torr, about 1·E-4 Torr, or about 1·E-3 Torr, or any sub-range or single value therein. The pressure in processing chamber 104 may be controlled by opening the throttle valve (e.g., throttle ISO valve 375) and with turbo or cryo pump 365. The SAM deposition is performed at a lower temperature than pressures used in existing SAM deposition methods. A turbo/cryo pump is utilized to achieve such lower pressures.

Method 700 also includes, prior to initiating SAM deposition, adjusting the temperature in the first processing chamber to a first temperature (730). The first temperature ranges from any of about 25° C., about 50° C., or about 100° C. to any of about 125° C., about 150° C., about 175° C., or about 200° C. The first temperature is controlled using the first heater which is a rotating heater in certain embodiments. In certain embodiments, the second heater, which is a lamp in certain embodiments, is off during SAM deposition.

Upon reaching the first pressure and the first temperature, method 700 includes flowing an evaporated low vapor pressure OM into the first processing chamber that includes the substrate (740). The low vapor pressure OM corresponds to any of the aforementioned low vapor pressure OMs in embodiments. The temperature of the flow path along which the low vapor pressure OM travels is maintained at an elevated temperature to prevent condensation of the vaporized low vapor pressure OM on various sections of the apparatus along the flow path. To maintain the elevated temperature, various components along the flow path of the low vapor pressure OM may have heaters or may be conductively heated by a heater in their vicinity. For instance, a heater may be disposed in each evaporator (such as heating element 348) and/or in the showerhead and certain components along the path from the evaporator to the processing environment (such as the showerhead liner, backing plate, lid plate, and so on) may be conductively heated by one or more of these heaters.

Method 700 further includes depositing, in the first processing chamber, the low vapor pressure OM onto at least a first portion of the substrate at the first temperature and at the first pressure to form a SAM on at least the first portion of the substrate (750). Depending on the inherent chemical selectivity of the functional group of the OM, the SAM will be deposited either on the metal portions of the substrate or on the dielectric portions of the substrate, as described in detail with respect to FIGS. 4A-4C and 5A to 5C above. Deposition of the SAM can occur over a duration ranging from any of about 5 minutes, about 10 minutes, about 15 minutes, or about 20 minutes to any of about 25 minutes, about 30 minutes, about 35 minutes, about 40 minutes, about 45 minutes, about 50 minutes, about 55 minutes, or about 60 minutes, or any single duration therein or sub-range of duration therein. During deposition of the SAM, the pressure of the process volume may be maintained in isobaric or non-isobaric state. Similarly, during deposition of the SAM, the temperature of the process volume may be maintained in an isothermal or non-isothermal state. The low vapor pressure OM vapors fill the process volume and is maintained in the process volume for a period of time prior to being exhausted from the process volume to allow sufficient time for the SAM to deposit onto the wafer.

During SAM deposition, condensation of the OM vapors occurs on the wafer, making the wafer not dry enough to transfer it out of the processing chamber to undergo further processing. Hence, the wafer is subjected to annealing to dry the chemistry on the wafer prior to transferring the wafer out of the SAM treatment processing chamber to undergo further processing (such as ALD).

Upon deposition of the SAM on the patterned substrate, method 700 includes increasing the pressure in the first processing chamber to a second pressure (760). The second pressure ranges from any of about 1 Torr, about 50 Torr, about 100 Torr, about 150 Torr, about 200 Torr, about 250 Torr, or about 300 Torr to any of about 350 Torr, about 400 Torr, about 450 Torr, about 500 Torr, about 550 Torr, about 600 Torr, or about 650 Torr. The second pressure is higher than the first pressure. The higher second pressure is reached by closing the throttle valve and using the rough line to control the pressure. The second pressure may also be referred to as "annealing pressure" since SAM annealing occurs at that pressure.

Upon deposition of the SAM on the patterned substrate, method 700 includes increasing the temperature in the first processing chamber to a second temperature (770). The second temperature ranges from any of about 100° C., about 125° C., or about 150° C. to any of about 175° C. or about 200° C., or any sub-range or single value therein. The second temperature is higher than the first temperature. The second temperature is reached by activating the second heater, which may be a lamp in a lamp assembly. Turning on the lamp in the lamp assembly increases the temperature of the substrate pedestal on which the substrate is placed. The second temperature may also be referred to as "annealing temperature" since SAM annealing occurs at that temperature.

Upon reaching the second pressure and the second temperature, method 700 includes annealing, in the first processing chamber, the SAM on at least the first portion of the substrate at the second temperature and the second pressure (780). The annealing may occur over a duration ranging from any of about 5 minutes, about 10 minutes, about 15 minutes, about 20 minutes, about 25 minutes, about 30 minutes, about 35 minutes, about 40 minutes, about 45 minutes, about 50 minutes, about 55 minutes, or about 60 minutes to any of about 65 minutes, about 70 minutes, about 75 minutes, about 80 minutes, about 85 minutes, about 90 minutes, about 95 minutes, about 100 minutes, about 105 minutes, about 110 minutes, about 120 minutes, about 150 minutes, about 180 minutes, or about 210 minutes, or any single duration therein or sub-range of duration therein. The annealing may further include flowing anneal gas with some similar chemistry to that of the SAM material, such as air, oxygen, and/or nitrogen gas. During annealing of the SAM, the pressure of the process volume may be maintained in isobaric or non-isobaric state. Similarly, during annealing of the SAM, the temperature of the process volume may be maintained in an isothermal or non-isothermal state.

In the embodiments described herein, the entire SAM treatment process, including SAM deposition and SAM annealing, occur in the same chamber. Use of a single chamber as described herein to perform both SAM deposition and SAM annealing generates a higher quality SAM in a more expedient manner (as compared to existing SAM treatment processes that involve processing in a plurality of distinct processing chambers). After the SAM material deposition and annealing process is performed on the substrate in the first processing chamber, the SAM treated substrate is transferred from the SAM processing chamber to an ALD chamber, such as process chamber 106, via the transfer chamber using the transfer chamber robot (790).

An ALD process is performed on the substrate to deposit a coating on a second portion of the substrate without depositing the ALD coating on the first portion of the substrate that includes the SAM (795). In certain embodiments, the ALD coating is one or more of $HfO_2$, $ZrO_2$, $Al_2O_3$, TaN, and TiN.

From the ALD processing chamber, the substrate is transferred via the transfer chamber and the transfer chamber robot to undergo further processing or to exit the processing environment via load lock 112.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±30%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A processing chamber, comprising:
   a chamber body and a lid plate, the chamber body and the lid plate defining an interior volume of the processing chamber, the lid plate supporting at least one evaporator;
   a substrate support disposed in the interior volume of the processing chamber;
   a showerhead disposed above the substrate support;
   a first heater disposed in the interior volume of the processing chamber in or on the substrate support, the first heater configured to provide temperature control during self-assembled monolayer (SAM) deposition;
   a second heater disposed in the interior volume of the processing chamber and proximate the chamber body, the second heater configured to provide temperature control during SAM annealing; and
   a controller configured to direct the SAM deposition, to direct the first heater to provide temperature control during the SAM deposition, and to direct the second heater to provide temperature control during the SAM annealing, wherein the second heater is not used to provide temperature control during the SAM deposition.

2. The processing chamber of claim 1, wherein the lid plate supports four evaporators, each evaporator positioned at one corner of four discrete corners of the lid plate.

3. The processing chamber of claim 2, wherein each evaporator is coupled to the lid plate and is configured to deliver a portion of a total amount of a SAM precursor gas via a portion of the showerhead to a portion of a processing region defined between the substrate support and the showerhead.

4. The processing chamber of claim 3, wherein the portion of the total amount of the SAM precursor gas is a quarter of the total amount of the SAM precursor gas, wherein the portion of the showerhead is a quarter of the showerhead, wherein the portion of the processing region is a quarter of the processing region, and wherein each evaporator of the four evaporators is configured to deliver a quarter of a total amount of the SAM precursor gas that is delivered to the processing region via the quarter of the showerhead to the quarter of the processing region such that all four evaporators together are configured to deliver the total amount of the SAM precursor gas to the processing region in its entirety via the showerhead in its entirety.

5. The processing chamber of claim 1, wherein the first heater is a rotating heater, and wherein the second heater is a lamp assembly.

6. The processing chamber of claim 1, further comprising at least one pressure control unit coupled to the chamber body, the at least one pressure control unit configured to provide pressure control during SAM deposition and SAM annealing.

7. A substrate processing system, comprising:
a first processing chamber configured to perform a self-assembled monolayer treatment process, the first processing chamber comprising:
a chamber body and a lid plate, the chamber body and the lid plate defining and interior volume of the first processing chamber, the lid plate supporting at least one evaporator;
a substrate support disposed in the interior volume of the first processing chamber;
a showerhead disposed above the substrate support;
a first heater disposed in the interior volume of the first processing chamber in or on the substrate support, the first heater configured to provide temperature control during self-assembled monolayer (SAM) deposition; and
a second heater disposed in the interior volume of the first processing chamber and proximate the chamber body, the second heater configured to provide temperature control during SAM annealing;
a second processing chamber configured to perform an atomic layer deposition process on a wafer subjected to a SAM treatment process in the first processing chamber; and
a controller configured to direct the SAM deposition, to direct the first heater to provide temperature control during the SAM deposition, and configured to direct the second heater to provide temperature control during the SAM annealing, wherein the second heater is not used to provide temperature control during the SAM deposition.

8. The substrate processing system of claim 7, wherein the lid plate supports four evaporators, each evaporator positioned at one corner of four discrete corners of the lid plate.

9. The substrate processing system of claim 8, wherein each evaporator is coupled to the lid plate and is configured to deliver a portion of a total amount of a SAM precursor gas via a portion of the showerhead to a portion of a processing region defined between the substrate support and the showerhead.

10. The substrate processing system of claim 9, wherein the portion of the total amount of the SAM precursor gas is a quarter of the total amount of the SAM precursor gas, wherein the portion of the showerhead is a quarter of the showerhead, wherein the portion of the processing region is a quarter of the processing region, and wherein each evaporator of the four evaporators is configured to deliver a quarter of a total amount of the SAM precursor gas that is delivered to the processing region via the quarter of the showerhead to the quarter of the processing region such that all four evaporators together are configured to deliver the total amount of the SAM precursor gas to the processing region in its entirety via the showerhead in its entirety.

11. The substrate processing system of claim 7, wherein the first heater is a rotating heater, and wherein the second heater is a lamp assembly.

12. The substrate processing system of claim 7, further comprising at least one pressure control unit coupled to the chamber body, the at least one pressure control unit configured to provide pressure control during SAM deposition and SAM annealing.

13. A processing chamber, comprising:
a chamber body and a lid plate, the chamber body and the lid plate defining an interior volume of the processing chamber, the lid plate supporting at least one evaporator comprising a receptacle with line of sight to the interior volume of the processing chamber, and configured to retain a SAM precursor substance;
a substrate support disposed in the interior volume of the processing chamber;
a showerhead disposed above the substrate support;
a first heater disposed in the interior volume of the processing chamber in or on the substrate support, the first heater configured to provide temperature control during self-assembled monolayer (SAM) deposition;
a second heater disposed in the interior volume of the processing chamber and proximate the chamber body, the second heater configured to provide temperature control during SAM annealing; and
a controller configured to direct the SAM deposition, to direct the first heater to provide temperature control during the SAM deposition, and to direct the second heater to provide temperature control during the SAM annealing, wherein the second heater is not used to provide temperature control during the SAM deposition.

* * * * *